(12) United States Patent
Miyamura et al.

(10) Patent No.: US 10,074,421 B2
(45) Date of Patent: Sep. 11, 2018

(54) CROSSBAR SWITCH TYPE MEMORY CIRCUIT, LOOK-UP TABLE CIRCUIT, AND PROGRAMMING METHOD

(71) Applicant: NEC Corporation, Minato-ku, Tokyo (JP)

(72) Inventors: Makoto Miyamura, Tokyo (JP); Noboru Sakimura, Tokyo (JP); Yukihide Tsuji, Tokyo (JP); Ryusuke Nebashi, Tokyo (JP); Tadahiko Sugibayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/550,463

(22) PCT Filed: Mar. 1, 2016

(86) PCT No.: PCT/JP2016/001092
§ 371 (c)(1),
(2) Date: Aug. 11, 2017

(87) PCT Pub. No.: WO2016/139926
PCT Pub. Date: Sep. 9, 2016

(65) Prior Publication Data
US 2018/0096724 A1    Apr. 5, 2018

(30) Foreign Application Priority Data
Mar. 3, 2015   (JP) ................. 2015-041455

(51) Int. Cl.
*G11C 11/00*    (2006.01)
*G11C 13/00*    (2006.01)
*H01L 27/24*    (2006.01)

(52) U.S. Cl.
CPC ........ *G11C 13/004* (2013.01); *H01L 27/2445* (2013.01); *H01L 27/2481* (2013.01)

(58) Field of Classification Search
CPC .................. G11C 13/004; H01L 27/2445; H01L 27/2481
(Continued)

(56) References Cited

U.S. PATENT DOCUMENTS

2005/0166134 A1* 7/2005 Nagai .................. G11C 7/1006
 714/823
2006/0023497 A1* 2/2006 Kawazoe ........... G11C 13/0007
 365/158

(Continued)

FOREIGN PATENT DOCUMENTS

JP    2005-101735 A    4/2005
JP    2015-026998 A    2/2015

(Continued)

OTHER PUBLICATIONS

Shunichi Kaeriyama et al., "A Nonvolatile Programmable Solid-Electrolyte Nanometer Switch", IEEE Journal of Solid-State Circuits, vol. 40, No. 1, pp. 168-176, Jan. 2005.

(Continued)

*Primary Examiner* — Anthan Tran

(57) ABSTRACT

In order to provide a crossbar switch type memory circuit designed to be usable in normal circumstances even when a resistance change element is in an adverse state, the present invention is provided with: a first unit including a first column wiring to which one end of a first resistance change element is connected, a first power supply-side transistor for controlling the connection of the first column wiring and a power supply node, a first ground-side transistor, of a reverse operation type to the first power supply-side transistor, for controlling the connection of the first column wiring and a ground node, and a first polarity control line for causing the first power supply-side transistor or the first ground-side transistor to turn on and the other to turn off by (Continued)

a polar signal from a polar signal terminal, the first polarity control line being connected to the control terminals of the first power supply-side transistor and first ground-side transistor; a second unit including a second column wiring to which one end of a second resistance change element is connected, a second power supply-side transistor, of the same operation type as the first power supply-side transistor, for controlling the connection of the second column wiring and the power supply node, a second ground-side transistor, of a reverse operation type to the second power supply-side transistor, for controlling the connection of the second column wiring and the ground node, a logic inversion circuit for inverting the polarity of the polar signal from the polar signal terminal and outputting the polarity-inverted signal, and a second polarity control line for causing the second power supply-side transistor or the second ground-side transistor to turn on and the other to turn off by a polar signal from the logic inversion circuit, the second polarity control line being connected to the control terminals of the second power supply-side transistor and second ground-side transistor; and n row wirings (n: positive integer) to which the other ends of the first and second resistance change elements are connected.

10 Claims, 18 Drawing Sheets

(58) Field of Classification Search
USPC .......................................................... 365/148
See application file for complete search history.

(56) References Cited

U.S. PATENT DOCUMENTS

| | | | |
|---|---|---|---|
| 2013/0235649 A1* | 9/2013 | Lindstadt | G11C 13/0035 365/148 |
| 2015/0138877 A1 | 5/2015 | Nebashi et al. | |
| 2015/0357032 A1* | 12/2015 | Tatsumura | H03K 19/1776 365/72 |

FOREIGN PATENT DOCUMENTS

| | | |
|---|---|---|
| WO | 2013/187193 A1 | 12/2013 |
| WO | 2014/181492 A1 | 11/2014 |

OTHER PUBLICATIONS

International Search Report for PCT Application No. PCT/JP2016/001092, dated May 10, 2016.
English translation of Written opinion for PCT Application No. PCT/JP2016/001092.

* cited by examiner

CROSSBAR SWITCH TYPE MEMORY CIRCUIT, LOOK-UP TABLE CIRCUIT, AND PROGRAMMING METHOD

This application is a National Stage Entry of PCT/JP2016/001092 filed on Mar. 1, 2016, which claims priority from Japanese Patent Application 2015-041455 filed on Mar. 3, 2015, the contents of all of which are incorporated herein by reference, in their entirety.

TECHNICAL FIELD

The present invention relates to a crossbar switch type memory circuit, a look-up table circuit, and a programming method.

BACKGROUND ART

The integration degree of a field effect transistor (MOS-FET: Metal Oxide Semiconductor Field Effect Transistor) in a semiconductor device has increased at a pace of four times in three years by a miniaturization technology.

In addition, usage of FPGA (Field Programmable Gate Array) or the like by which a designer can electrically reconfigure a desired function for a manufactured semiconductor device increases. However, in order for the FPGA to have the same function as a custom-designed semiconductor device, the number of transistors integrated larger by one or more orders of magnitude is required. Thus, a current FPGA had a problem in that the area efficiency is low and the power consumption is large.

In recent years, a study in which an overhead of the FPGA is reduced and the power consumption is reduced by mounting a variable resistance element on a circuit substrate of a multi-layer wiring layer and programming a resistance state of the variable resistance element is performed.

Examples of the variable resistance element include a ReRAM (Resistance Random access Memory) using a transition metal oxide and Nano bridge (registered trademark) using an ion conductor.

In PTL1 and NPL1, a variable resistance element using the movement of metal ions and electrochemical reactions with the use of a solid (ion conductor) in which ions can freely move by application of an electric field or the like is disclosed.

The variable resistance element is composed of an ion conduction layer, and a first electrode and a second electrode arranged with the ion conduction layer sandwiched therebetween. In this case, metal ions are supplied from the first electrode to the ion conduction layer, but metal ions are not supplied from the second electrode. A resistance value of the ion conductor is changed by changing the polarity of an applied voltage, thereby controlling a conduction state between the two electrodes.

In addition, in PTL1 and NPL1, a technique in which a variable resistance element is used for ULSI (Ultra-Large Scale Integration) as a crossbar switch is disclosed. The crossbar switch acts to switch wirings, and is used when recomposing a circuit element (reconfigurable logic circuit). Examples of the circuit element include a look-up table circuit (LUT circuit) for expressing an arbitrary truth value. FIG. 11 is a diagram illustrating such a LUT circuit 100.

The LUT circuit 100 includes a memory unit 101 for storing a truth value, an external signal input unit 102, and a data selection unit 103, and is configured such that the data selection unit 103 selects data from the memory unit 101 in accordance with an external signal (selection signal) from the external signal input unit 102 and outputs the data.

When the LUT circuit 100 is configured by a CMOS (Complementary Metal Oxide Semiconductor) circuit, generally, SRAM (Static Random access Memory) is widely used in the memory unit 101. Needless to say, the LUT circuit may be configured by using a variable resistance element in place of the SRAM.

In order to achieve the LUT circuit using the variable resistance element, it is considered that a crossbar switch having a configuration of n×2 (n: the number of input bits of the LUT circuit 100) is used in place of the SRAM as the memory unit 101 thereof. In the crossbar switch, variable resistance elements are connected to intersection points of column wirings with row wirings, and two variable resistance elements connected to row wirings are programmed (set) to be complementary in an L resistance state (hereinafter, L resistance state) and an H resistance state (hereinafter, H resistance state). Accordingly, one-bit data can be expressed. FIG. 12 is a diagram in which a crossbar switch 114 is configured by connecting variable resistance elements 113 (113a, 113b) to column wirings 111 (111a, 111b) and row wirings 112.

During operating the LUT circuit, one column wiring (for example, the column wiring 111a) is programmed to be a low voltage level, and the other column wiring (for example, the column wiring 111b) is programmed to be a high voltage level. Accordingly, each of row wirings 112 becomes the high voltage level or the low voltage level in accordance with a program condition. Hereinafter, the low voltage level is described as an L level, and the high voltage level is described as an H level.

It is to be noted that, in the present description, setting the variable resistance element to be in the H resistance state or the L resistance state is described as programming. The foregoing programming is performed by applying a predetermined voltage value to or making a current flow in the variable resistance element.

Signals of the row wirings 112 are inputted into a selection circuit (MUX) 115, and one signal is selected by the selection circuit 115. Therefore, the signal selected by the selection circuit 115 is read by a read circuit (not illustrated), so that the resistance state of the variable resistance element, that is, programmed and stored data can be read.

CITATION LIST

Patent Literature

[PTL1] Japanese Patent Application Laid-open No. 2005-101735

Non Patent Literature

[NPL1] Shunichi Kaeriyama et al., "A Nonvolatile Programmable Solid-Electrolyte Nanometer Switch", IEEE Journal of Solid-State Circuits, Vol. 40, No. 1, pp. 168-176, January 2005.

SUMMARY OF INVENTION

Technical Problem

However, the variable resistance element sometimes becomes a defect state, such as an open state and a short state, during an initial state or performing programming (which means during use). It is to be noted that, since the open state is a disconnection state, the variable resistance element becomes the H resistance state, and since the short state is a short circuit state, the variable resistance element becomes the L resistance state.

In addition, even when being programmed to be in the H resistance state, the variable resistance element does not become the H resistance state having sufficiently high resistance, and sometimes becomes an intermediate state between the H resistance state and the L resistance state. In the foregoing intermediate resistance state, for example, a resistance value smaller than a resistance value desired for the H resistance state by about one order to three orders of magnitude is obtained, thereby generating a large leakage current.

When the above-described defect state (open state, short state, leakage state) occurs, a problem in that the defect state is a cause of malfunction and a large standby current flows is caused. FIG. 13 is a diagram illustrating the resistance states of the variable resistance elements, a black square indicates a normal L resistance state, a white square indicates a normal H resistance state, a crosshatched square indicates a defective leakage state, a hatched square with diagonally downward lines indicates a defective short state, and a hatched square with diagonally upward lines indicates a defective open state.

FIG. 14A and FIG. 14B are diagrams each illustrating a crossbar switch type memory circuit composed of the foregoing variable resistance elements. When a variable resistance element P1 which should be originally programmed to be in the H resistance state is in the short state, a column wiring K1 at the H level and a column wiring K2 at the L level short-circuit through the other variable resistance element P2 written to be in the L resistance state, and a short-circuit current flows. FIG. 14A is a diagram illustrating this state. It is to be noted that FIG. 14B illustrates a case when the variable resistance element P1 is in the open state.

In this case, in addition to flowing of the short-circuit current, when a resistance value of the variable resistance element P1 in the short state is the same degree as an original L resistance value, a column wiring K3 that is a read row becomes an intermediate level and is read to be a false logic level in a later stage read circuit, and a reconfigurable circuit may malfunction.

In the same manner, when a variable resistance element which should be programmed to be in the L resistance state has an open defect, although the short-circuit current does not flow, a row wiring becomes an undefined state (intermediate state) and is read to be a false logic level in a later stage read circuit, and a reconfigurable circuit may malfunction.

Since the foregoing open defect and short defect sometimes subsequently occur due to program processing of the resistance state of the variable resistance element in addition to initial failure that occurs in a manufacturing process, it has been difficult to find a defect by sorting processing in product shipment.

It is a main object of the present invention to provide a crossbar switch type memory circuit, a look-up table circuit, and a programming method which can be normally used even when a variable resistance element is in a defect state.

Solution to Problem

To solve the above-mentioned problem, an invention according to a crossbar switch type memory circuit for storing information in accordance with a resistance state of a variable resistance element, is characterized in that the crossbar switch type memory circuit comprises: a first unit including a first column wiring to which one end of a first variable resistance element is connected, a first power supply-side transistor that controls a connection of the first column wiring and a power supply node, a first ground-side transistor that controls a connection of the first column wiring and a ground node, which is an opposite operation type to the first power supply-side transistor, and a first polarity control line that is connected to control terminals of the first power supply-side transistor and the first ground-side transistor, and turns on one of the first power supply-side transistor and the first ground-side transistor and turns off the other thereof by a polarity signal from a polarity signal terminal; a second unit including a second column wiring to which one end of a second variable resistance element is connected, a second power supply-side transistor that controls a connection of the second column wiring and the power supply node, which is the same operation type as the first power supply-side transistor, a second ground-side transistor that controls a connection of the second column wiring and the ground node, which is an opposite operation type to the second power supply-side transistor, a logic inversion circuit that inverts a polarity of the polarity signal from the polarity signal terminal and outputs the polarity-inverted signal, and a second polarity control line that is connected to control terminals of the second power supply-side transistor and the second ground-side transistor, and turns on one of the second power supply-side transistor and the second ground-side transistor and turns off the other thereof by the polarity signal from the logic inversion circuit; and n row wirings (n: positive integer) to which the other ends of the first and second variable resistance elements are connected, wherein a one-bit memory is formed by the first variable resistance element and the second variable resistance element, and information stored in the memory is outputted from the corresponding row wiring.

Moreover, an invention according to a look-up table circuit used when reconfiguring a logic circuit by a crossbar switch formed by a variable resistance element, is characterized by comprising: the crossbar switch type memory circuit; and a selection circuit that selects one piece of data from a plurality of pieces of data outputted from the crossbar switch type memory circuit.

Furthermore, an invention according to a programming method of a crossbar switch type memory circuit, in which resistance states of first and second variable resistance elements are programmed to be complementary and data is stored, is characterized in that when information written by programming the first variable resistance element to be in a high resistance state or a low resistance state and programming the second variable resistance element to be in the low resistance state or the high resistance state is designated as write data, and information obtained by reading the written information is designated as read data, when the write data written in the crossbar switch type memory circuit and the read data read at this time do not coincide, performing writing again with data obtained by inverting a polarity of the write data.

Advantageous Effect of Invention

According to the present invention, a crossbar switch type memory circuit can be normally used even when a variable resistance element is in a defect state.

DESCRIPTION OF EMBODIMENTS

Before describing example embodiments of the present invention, a variable resistance element, which is basic to the embodiments, will be described. A variable resistance element is formed by arranging a resistive switching layer between two electrodes (a first electrode and a second electrode), and takes an H resistance state and an L resistance state in accordance with a voltage applying condition. Examples of a switch using the foregoing variable resistance element include a bipolar type switch and a unipolar type switch.

(Unipolar Type Switch)

Figure 1A:
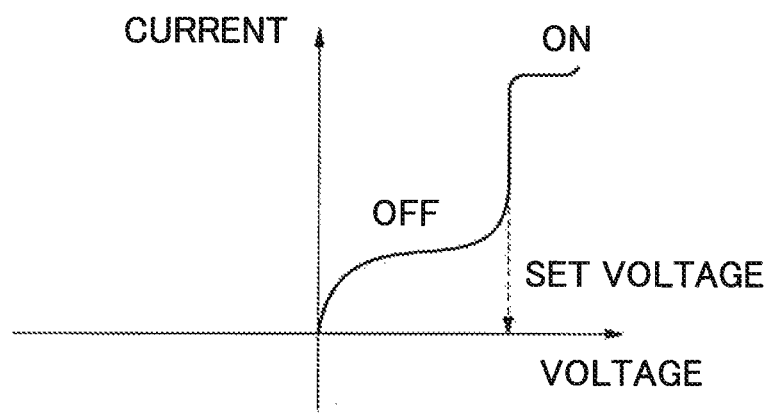
FIG. 1A is a diagram illustrating characteristics of a unipolar type switch that transits from an H resistance state to an L resistance state when an applied voltage value exceeds a predetermined set voltage value.

FIG. 1A to FIG. 1D are diagrams illustrating operating characteristics of a unipolar type switch. When a positive voltage value is applied to a first electrode and the applied voltage value exceeds a predetermined set voltage value, the unipolar type switch transits from the H resistance state to the L resistance state (FIG. 1A).

It is to be noted that the set voltage value and a reset voltage value described below are characteristic values determined dependently on a film thickness, composition, density, and the like of a resistive switching layer. In addition, a voltage value at which a resistance value of the resistive switching layer transits from the H resistance state to the L resistance state is the set voltage value, and a voltage value at which the resistance value of the resistive switching layer transits conversely from the L resistance state to the H resistance state is the reset voltage value.

When a voltage value larger than a reset voltage value is applied to the foregoing unipolar type switch in the L resistance state, the unipolar type switch transits from the L resistance state to the H resistance state. Furthermore, when the applied positive voltage value is increased and the voltage value exceeds the set voltage value, the unipolar type switch transits from the H resistance state to the L resistance state again (FIG. 1B).

Figure 1B:
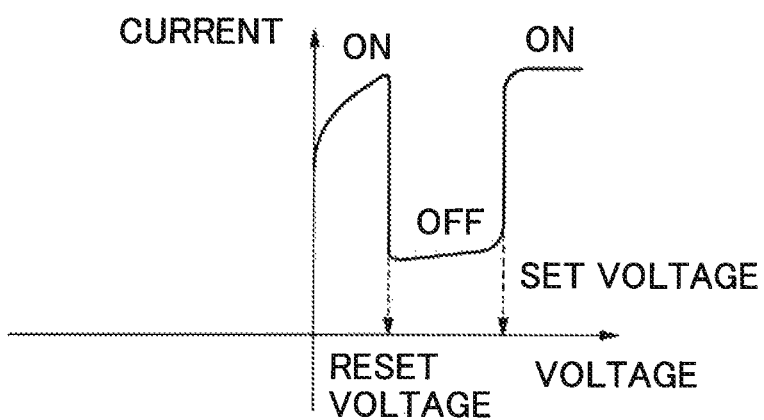
FIG. 1B is a diagram illustrating characteristics of the unipolar type switch that transits from the H resistance state to the L resistance state again when the applied positive voltage value exceeds the set voltage value.
Figure 1C:
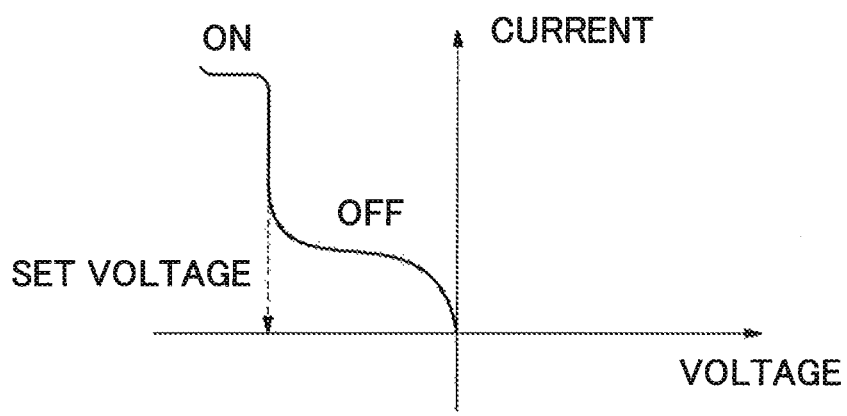
FIG. 1C is a diagram illustrating characteristics of the unipolar type switch that transits from the H resistance state to the L resistance state when an applied voltage value exceeds a set voltage value.

In contrast, when a negative voltage value is applied to the first electrode and the voltage value exceeds a set voltage value, the unipolar type switch transits from the H resistance state to the L resistance state (FIG. 1C).

When the negative voltage value applied to the first electrode exceeds a reset voltage value in the foregoing unipolar type switch in the L resistance state, the unipolar type switch transits from the L resistance state to the H resistance state. Furthermore, when the applied negative voltage value exceeds the set voltage value, the unipolar type switch transits from the H resistance state to the L resistance state again (FIG. 1D).

Figure 1D:
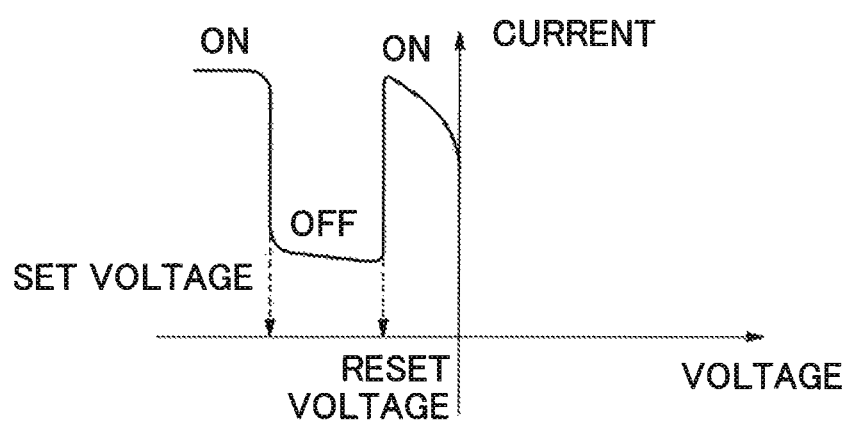
FIG. 1D is a diagram illustrating characteristics of the unipolar type switch that transits from the H resistance state to the L resistance state again when the applied negative voltage value exceeds the set voltage value.

As described above, the unipolar type switch depends on not the polarity of the applied voltage value but only the applied voltage value, and has features exhibiting the resistive switching characteristics of FIG. 1A and FIG. 1B and the resistive switching characteristics of FIG. 1C and FIG. 1D.

(Bipolar Type Switch)

Unlike the foregoing unipolar type switch, a bipolar type switch switches between the H resistance state and the L resistance state in accordance with the polarity of an applied voltage value (when a voltage value applied to a first electrode is higher than a voltage value applied to a second electrode is defined as a positive polarity).

Figure 2A:
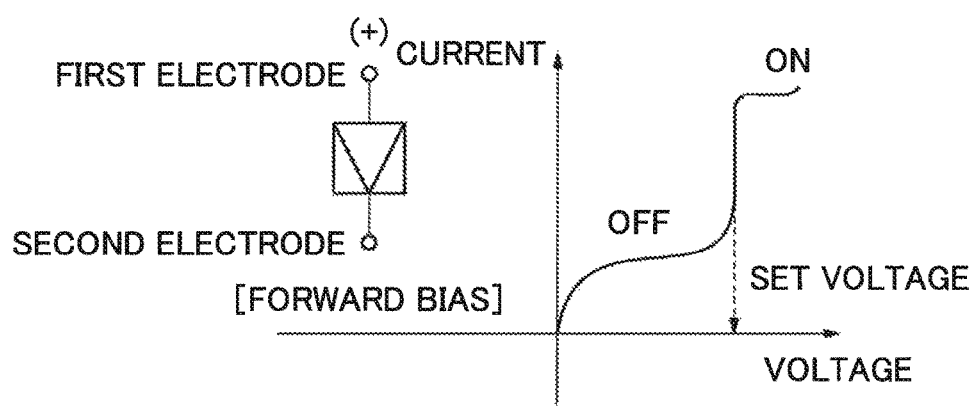
FIG. 2A is a diagram illustrating characteristics of a unipolar type switch that transits from the H resistance state to the L resistance state when an applied voltage value exceeds a set voltage value.

FIG. 2A to FIG. 2D are diagrams illustrating operating characteristics of the bipolar type switch. A positive voltage value is applied to the first electrode. Then, when the applied voltage value exceeds a set voltage value, the bipolar type switch transits from the H resistance state to the L resistance state (FIG. 2A). Hereinafter, the foregoing voltage value applying condition is described as a forward bias.

Figure 2B:
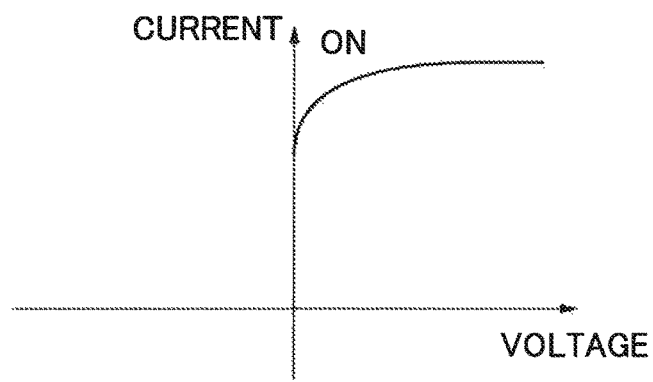
FIG. 2B is a diagram illustrating ohmic current-voltage value characteristics of the bipolar type switch exhibited when the applied voltage value is increased.

Then, when the applied voltage value is increased, the bipolar type switch exhibits ohmic current-voltage value characteristics (FIG. 2B).

Figure 2C:
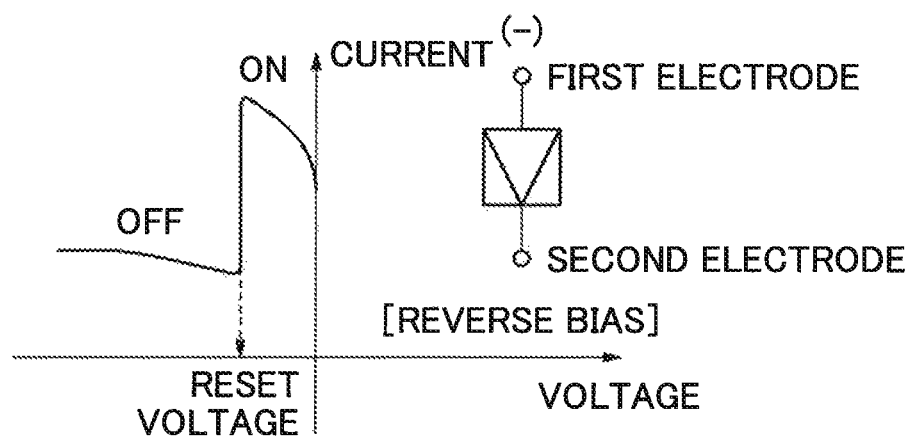
FIG. 2C is a diagram illustrating characteristics of the bipolar type switch that transits from the L resistance state to the H resistance state when an applied voltage value of a negative voltage value exceeds a reset voltage value.

Next, a negative voltage value is applied to the first electrode. When the applied voltage value exceeds a reset voltage value, the bipolar type switch transits from the L resistance state to the H resistance state (FIG. 2C). Hereinafter, the foregoing voltage value applying condition is described as a reverse bias.

Figure 2D:
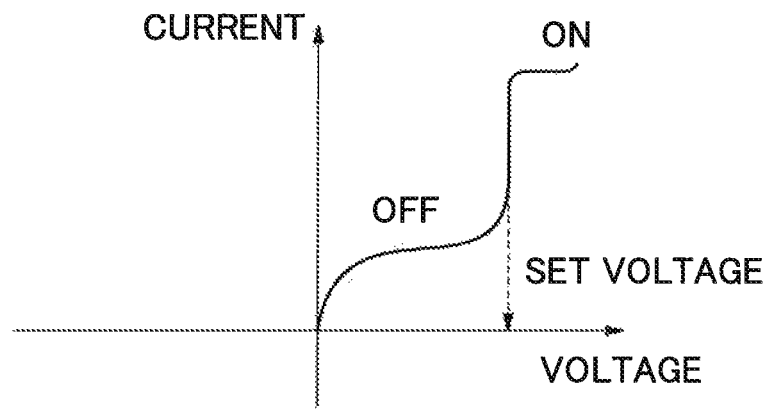
FIG. 2D is a diagram illustrating characteristics of the bipolar type switch that transits from the H resistance state to the L resistance state when a positive voltage value exceeding the set voltage value is applied to the bipolar type switch in the H resistance state.

Furthermore, the positive voltage value is applied to the first electrode of the bipolar type switch in the H resistance state again. Then, when the positive voltage value becomes larger than the set voltage value, the bipolar type switch transits from the H resistance state to the L resistance state (FIG. 2D).

As described above, the bipolar type switch switches between the H resistance state and the L resistance state in accordance with the polarity of the applied voltage value.

Figure 3:
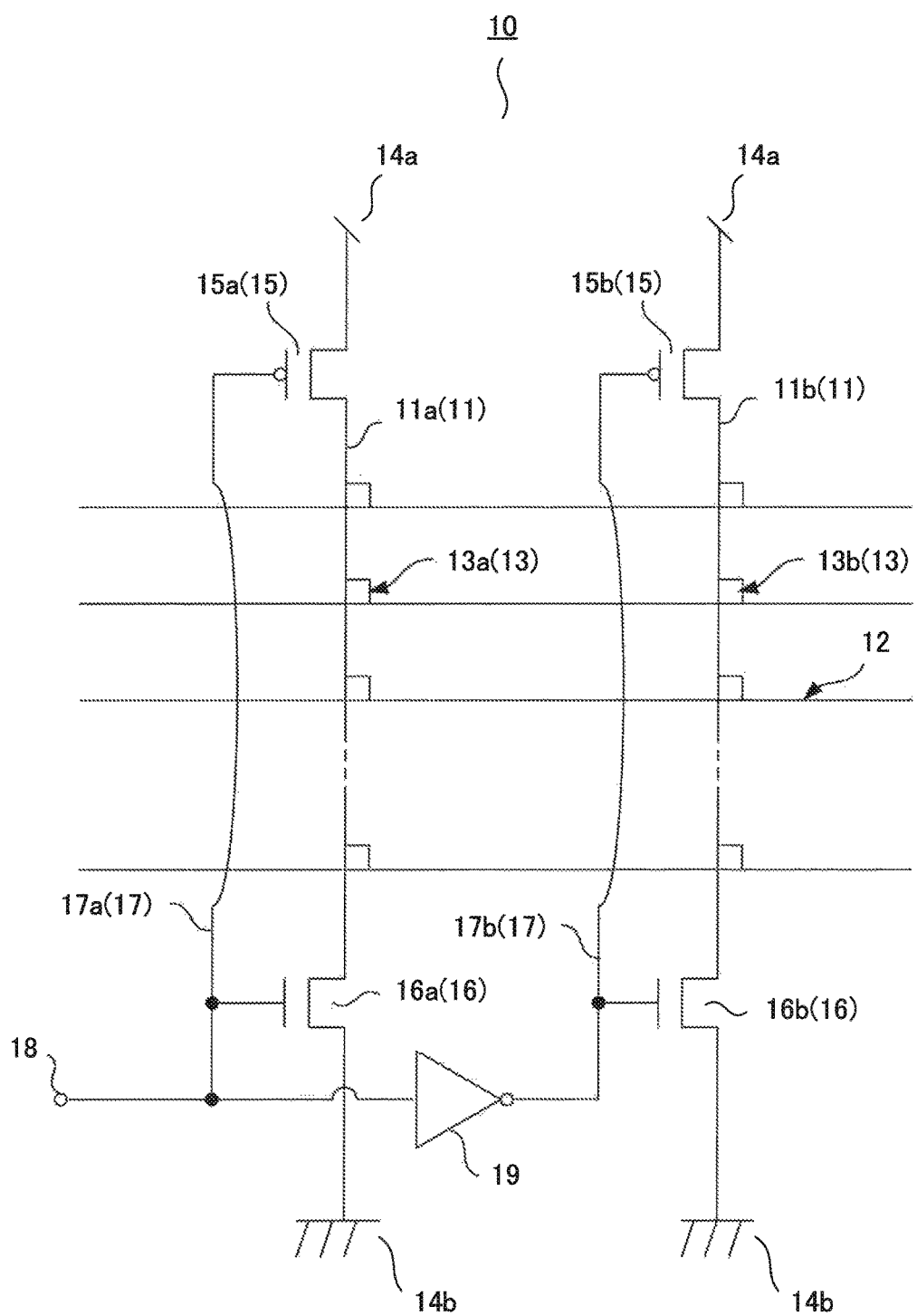
FIG. 3 is a configuration diagram of a crossbar switch type memory circuit used for describing a programming method when a defect occurs in a variable resistance element.

Next, a programming method when a defect occurs in the foregoing variable resistance element will be described. FIG. 3 is a configuration diagram of a crossbar switch type memory circuit 10 configured by using the above-described variable resistance element (which may be the unipolar type or the bipolar type).

The crossbar switch type memory circuit 10 includes column wirings 11 (11a, 11b), n row wirings (n: positive integer) 12, variable resistance elements 13, power supply-side transistors 15, ground-side transistors 16, polarity control lines 17, and an inverter (logic inversion circuit) 19.

It is to be noted that the power supply-side transistors 15 are transistors arranged on the side of power supply nodes 14a, and the ground-side transistors 16 are transistors arranged on the side of ground nodes 14b.

The column wirings 11 comprise a first column wiring 11a and a second column wiring 11b. When the crossbar switch type memory circuit 10 functions as an n-bit data memory, the n row wirings 12 are provided.

The variable resistance elements 13 comprise a first variable resistance element 13a and a second variable resistance element 13b. One electrode of each of the variable resistance elements 13 is connected to the row wiring 12, and the other electrode thereof is connected to the column wiring 11.

The power supply-side transistors 15 comprise a first power supply-side transistor 15a and a second power supply-side transistor 15b. One end of the first power supply-side transistor 15a is connected to the power supply node 14a, and the other end thereof is connected to the first column wiring 11a. In addition, one end of the second power supply-side transistor 15b is connected to the power supply node 14a, and the other end thereof is connected to the second column wiring 11b.

The ground-side transistors 16 comprise a first ground-side transistor 16a and a second ground-side transistor 16b. One end of the first ground-side transistor 16a is connected to the ground node 14b, and the other end thereof is connected to the first column wiring 11a. In addition, one end of the second ground-side transistor 16b is connected to the ground node 14b, and the other end thereof is connected to the second column wiring 11b.

The first power supply-side transistor 15a and the second power supply-side transistor 15b are formed by p-type field effect transistors (FETs), and the first ground-side transistor 16a and the second ground-side transistor 16b are formed by n-type FETs. The operation types of the p type and the n type are opposite types, and hereinafter, a different operation type is described as an opposite operation type, and the same operation type is described as the same operation type.

At this time, a gate terminal of the FET is appropriately described as a control terminal, and a source terminal and a drain terminal of the FET are appropriately described as an input terminal and an output terminal. It is to be noted that the first power supply-side transistor 15a, the second power supply-side transistor 15b, and the like are three-terminal transistors, and thus, bipolar transistors can be used. In this case, the control terminal is a base terminal, and the input terminal and the output terminal are a cathode terminal and a collector terminal.

The polarity control lines 17 comprise a first polarity control line 17a and a second polarity control line 17b. One end of the first polarity control line 17a is connected to the control terminals of the first power supply-side transistor 15a and the first ground-side transistor 16a, and the other end thereof is connected to a polarity signal terminal 18. In addition, one end of the second polarity control line 17b is connected to the control terminals of the second power supply-side transistor 15b and the second ground-side transistor 16b, and the other end thereof is connected to an output of the inverter 19.

It is to be noted that the column wiring 11 and the row wiring 12 are wired in an interlinked state, one electrode of the variable resistance element 13 is connected to the column wiring 11, and the other electrode thereof is connected to the row wiring 12. Accordingly, a crossbar switch in which the column wiring 11 and the row wiring 12 are connected through the variable resistance element 13 is configured.

An input terminal of the inverter 19 is connected to the polarity signal terminal 18 into which a polarity signal is inputted. Therefore, a polarity signal logically inverted (level inverted) by the inverter 19 is inputted into the second polarity control line 17b. It is to be noted that the polarity signal is a signal that controls on/off of the first power supply-side transistor 15a, the second power supply-side transistor 15b, the first ground-side transistor 16a, and the second ground-side transistor 16b.

Accordingly, one column wiring 11 of the first column wiring 11a and the second column wiring 11b is biased to an H level, which is equal to the level of the power supply node 14a, and the other column wiring 11 is biased to an L level, which is equal to the level of the ground node 14b. More specifically, the first variable resistance element 13a and the second variable resistance element 13b are programmed to be complementary. Accordingly, the H level or the L level is outputted to the row wiring 12 in accordance with the resistance states of the variable resistance elements 13, and the crossbar switch type memory circuit 10 functions as an n-bit data memory.

It is to be noted that a first unit is composed of the first column wiring 11a, the first power supply-side transistor 15a, the first ground-side transistor 16a, and the first polarity control line 17a. One end of the first variable resistance element 13a is connected to the first column wiring 11a. The first power supply-side transistor 15a controls a connection of the first column wiring 11a and the power supply node 14a. The first ground-side transistor 16a controls a connection of the first column wiring 11a and the ground node 14b. The first polarity control line 17a is connected to the control terminals of the first power supply-side transistor 15a and the first ground-side transistor 16a, and turns on one of the first power supply-side transistor 15a and the first ground-side transistor 16a and turns off the other thereof by the polarity signal from the polarity signal terminal 18.

In addition, a second unit is composed of the second column wiring 11b, the second power supply-side transistor 15b, the second ground-side transistor 16b, the inverter 19, and the second polarity control line 17b. One end of the second variable resistance element 13b is connected to the second column wiring 11b. The second power supply-side transistor 15b controls a connection of the second column wiring 11b and the power supply node 14a. The second ground-side transistor 16b controls a connection of the second column wiring 11b and the ground node 14b. The inverter 19 inverts the polarity of the polarity signal from the polarity signal terminal 18 and outputs the polarity-inverted signal. The second polarity control line 17b is connected to the control terminals of the second power supply-side transistor 15b and the second ground-side transistor 16b, and turns on one of the second power supply-side transistor 15b and the second ground-side transistor 16b and turns off the other thereof by the polarity signal from the inverter 19.

Figure 13:
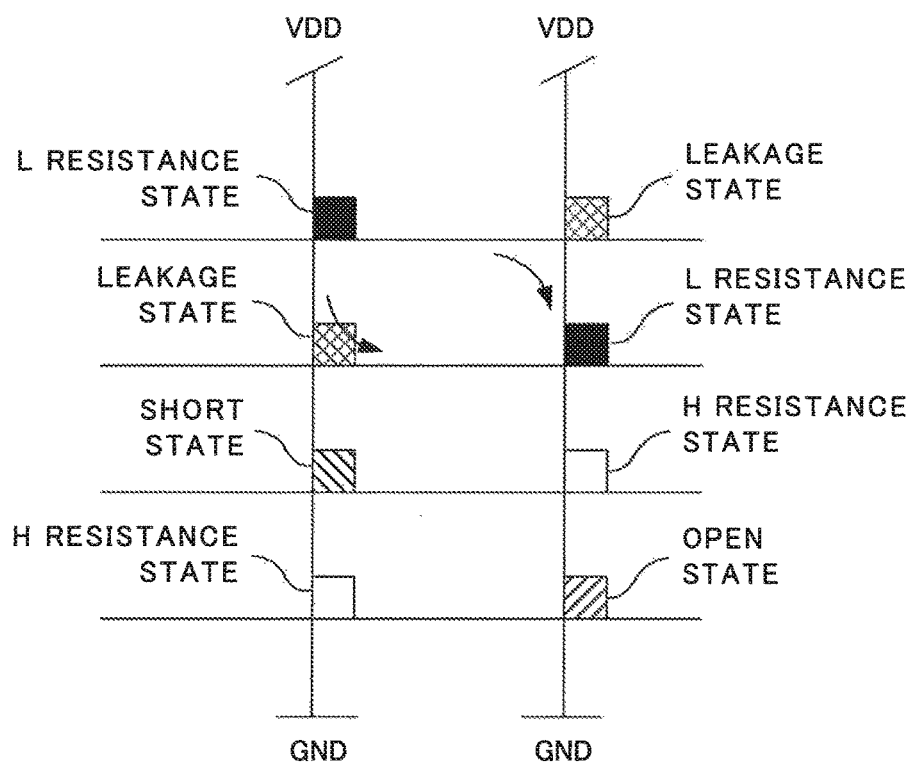
FIG. 13 is a diagram illustrating resistance states of variable resistance elements.
Figure 14A:
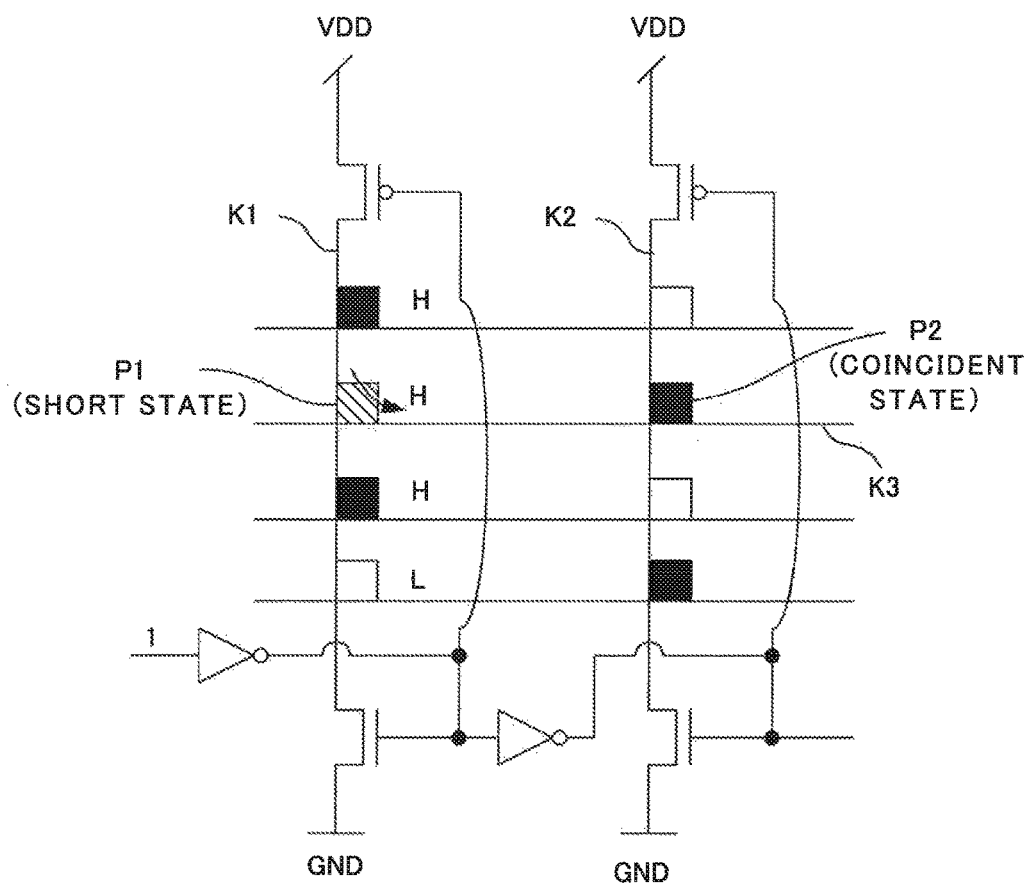
FIG. 14A is a diagram illustrating a crossbar switch type memory circuit composed of variable resistance elements in which one variable resistance element is in a short state.
Figure 14B:
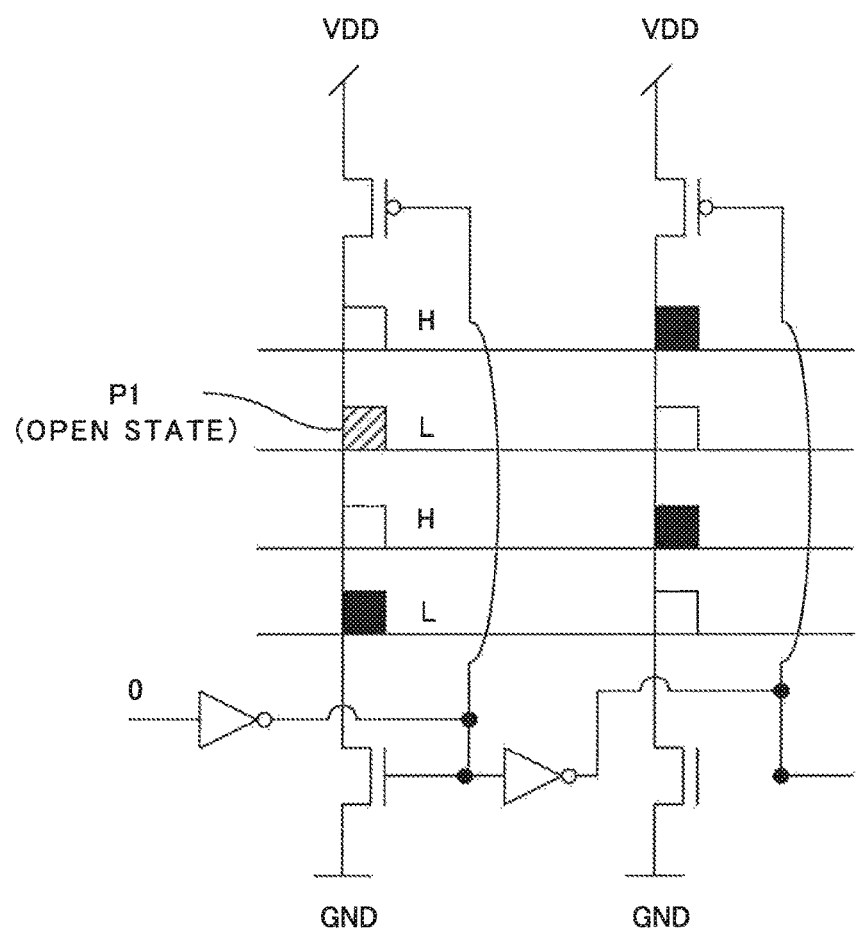
FIG. 14B is a diagram illustrating a crossbar switch type memory circuit composed of variable resistance elements in which one variable resistance element is in an open state.

Preferably, the foregoing variable resistance element 13 is constantly in a normal state. However, the variable resistance element 13 sometimes becomes a defect state depending on a manufacturing process and a using situation. As illustrated in FIG. 13, a leakage state, a short state, and an open state are considered as a defect mode.

Here, a case when the first variable resistance element 13a is in the open state is assumed. When the first variable resistance element 13a is in the open state, the first variable resistance element 13a maintains the H resistance state when being programmed at any level. Therefore, a problem does not occur particularly when the first variable resistance element 13a is made to be in the H resistance state. More specifically, a signal level of the row wiring 12 becomes a normal level.

However, when being programmed to be in the L resistance state, the first variable resistance element 13a cannot be programmed to be in the L resistance state, and the other, the second variable resistance element 13b is programmed to be in the H resistance state. Therefore, both of the variable resistance elements 13 become the H resistance state, the row wiring 12 becomes an undefined state, and the crossbar switch type memory circuit 10 does not function properly as a memory.

Next, a case when the first variable resistance element 13a is in the short state is assumed. When the first variable resistance element 13a is in the short state, the first variable resistance element 13a maintains the L resistance state when being programmed at any level. Therefore, a problem does not occur particularly when the first variable resistance element 13a is programmed to be in the L resistance state. More specifically, a signal level of the row wiring 12 becomes a normal level.

However, when being programmed to be in the H resistance state, the first variable resistance element 13a cannot be programmed to be in the H resistance state, and the other, the second variable resistance element 13b is programmed to be in the L resistance state. Therefore, both of the variable resistance elements 13 become the L resistance state. Therefore, the row wiring 12 and the column wirings 11 become a conduction state. A level of the row wiring becomes an intermediate level between the H level and the L level in accordance with the degree of conduction.

Figure 4:
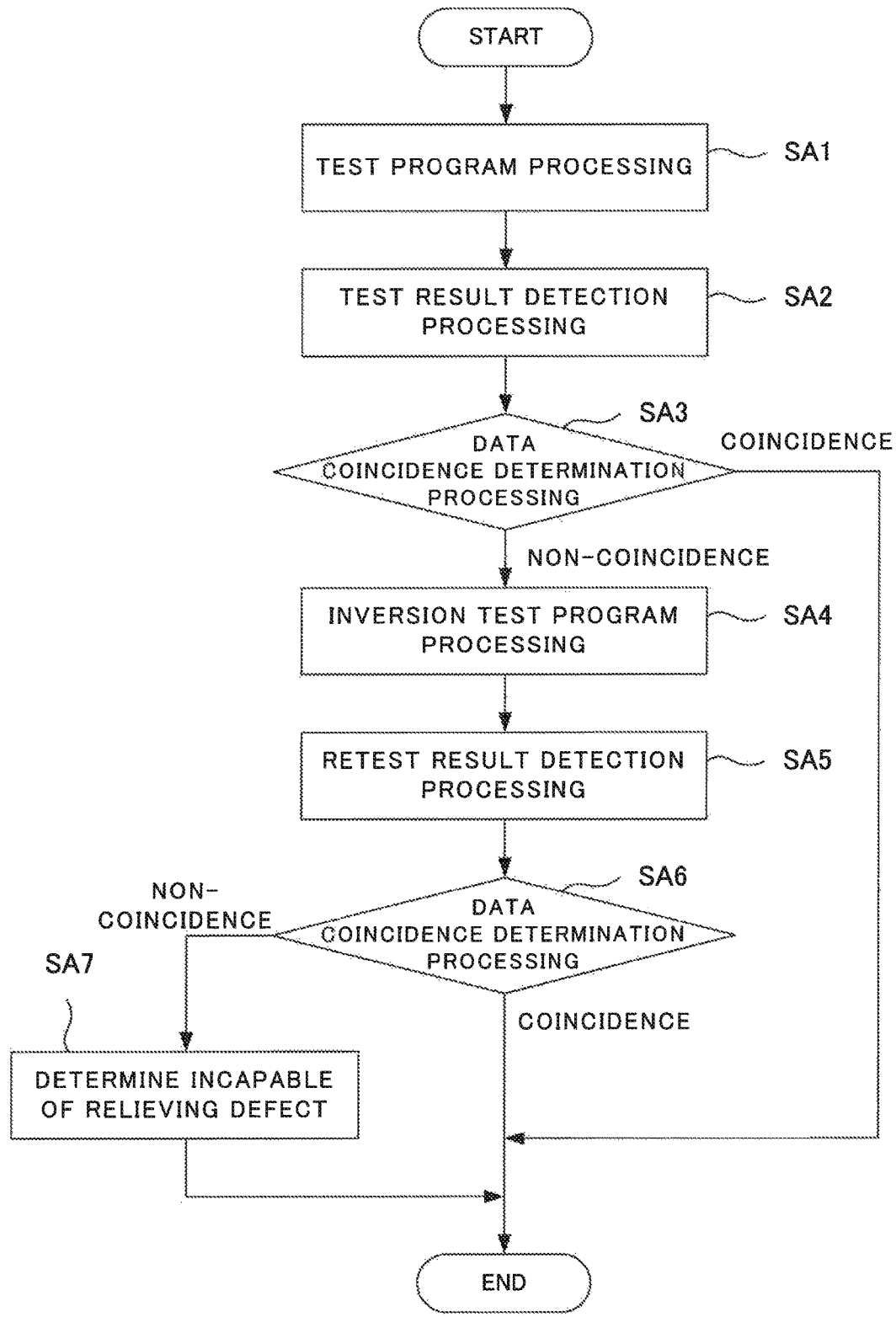
FIG. 4 is a flow chart illustrating a defect relieving procedure.

In the present example embodiment, the crossbar switch type memory circuit 10 is relieved from the influence of a defective variable resistance element 13 by the following procedure. FIG. 4 is a flowchart illustrating a defect relieving procedure.

Step SA1: (Test Program Processing)

First, a program signal (polarity signal) that sets each of the variable resistance elements 13 of the 2×n crossbar switch type memory circuit 10 to be in an intended resistance state is applied to the polarity signal terminal 18. Here, as the intended resistance state, a case when the first variable resistance element 13a is programmed to be in the H resistance state and the second variable resistance element 13b is programmed to be in the L resistance state is taken as an example. At this time, a signal (information) expected to be outputted to the row wiring 12 in accordance with programming is described as write data. More specifically, the write data is data to be stored in the 2×n crossbar switch type memory circuit 10, and is a signal level outputted from the row wiring 12 when the variable resistance elements 13 are normal. On the other hand, read data described below is data outputted from the row wiring 12.

Steps SA2, SA3: (Test Result Detection Processing), (Data Coincidence Determination Processing)

Next, a read signal (polarity signal) is inputted into the polarity signal terminal 18, and the signal level of the row wiring 12 is detected. The signal is the read data. Then, a coincidence between the read data and the write data is determined.

When the read data coincides with the write data, it is determined that each of the variable resistance elements 13 is normal. In contrast, when the read data and the write data do not coincide, it is determined that a defect exists in each of the variable resistance elements 13, and the processing proceeds to Step SA4.

Step SA4: (Inversion Test Program Processing)

When the read data and the write data do not coincide, programming is performed again for each of the variable resistance elements 13. A program condition at this time is a condition in which a resistance state opposite to the resistance state when performing programming in Step SA1 is obtained (level inverted application). More specifically, when the write data in Step SA1 is data that sets the first variable resistance element 13a to be in the H resistance state and sets the second variable resistance element 13b to be in the L resistance state, write data in inversion test program processing is data that sets the first variable resistance element 13a to be in the L resistance state and sets the second variable resistance element 13b to be in the H resistance state.

Steps SA5, SA6 (Retest Result Detection Processing), (Data Coincidence Determination Processing)

Then, the same processing as Steps SA2 and SA3 is performed, and a coincidence between the write data and the read data is determined. Hereinafter, the write data and the read data in retest result detection processing and data coincidence determination processing are described as rewrite data and reread data.

When the rewrite data and the reread data do not coincide, it is determined that both of a pair of variable resistance elements 13 that is complementarily provided are defective, and the processing proceeds to Step SA7. In contrast, when the rewrite data and the reread data coincide, it is determined that programming could be normally performed.

The determination that the rewrite data and the reread data coincide means that, although the pair of variable resistance elements 13 was defective, the defect could be relieved by changing the program condition in the inversion test program processing.

Step SA7: When the rewrite data and the reread data do not coincide, the defect cannot be relieved by changing the program condition (by inverting the write data), and thus, the processing is terminated. At this time, defect information may be outputted.

Accordingly, even if one of the pair of variable resistance elements is defective, programming can be performed such that the influence of the defect does not appear, and thus, the reliability of the 2×n crossbar switch type memory circuit is improved.

It is to be noted that, in the above description, p-type FETs are used for the power supply-side transistors and n-type FETs are used for the ground-side transistors, but n-type FETs may be used for the power supply-side transistors and p-type FETs may be used for the ground-side transistors. In this case, respective voltage values of a pair of column wirings 11 are reduced by Vth of a n FET and Vth of a p FET, and thus, a leakage current in the variable resistance elements can be reduced.

In addition, since the leakage current is a current that flows in the column wirings and the row wirings, the current may be directly measured. One having a smaller leakage current value of the first variable resistance element and the second variable resistance element is set to be in the high resistance state.

Figure 5A:
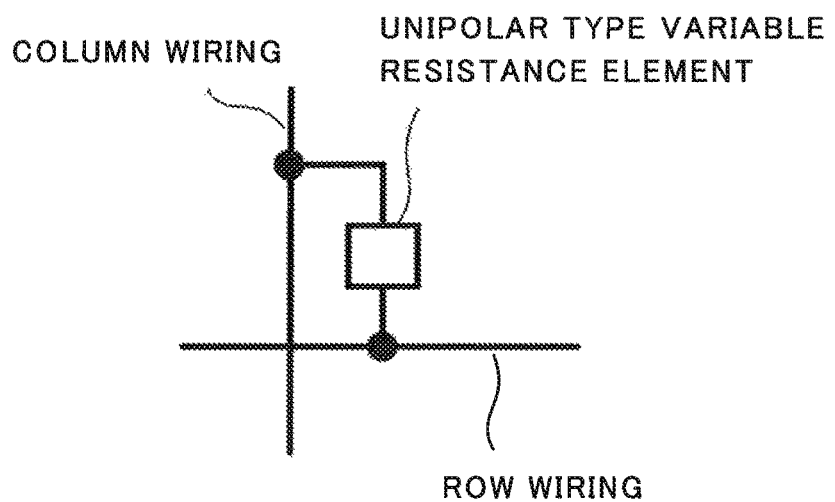
FIG. 5A is a diagram illustrating a connection configuration of a variable resistance element of a unipolar type variable resistance element.
Figure 5B:
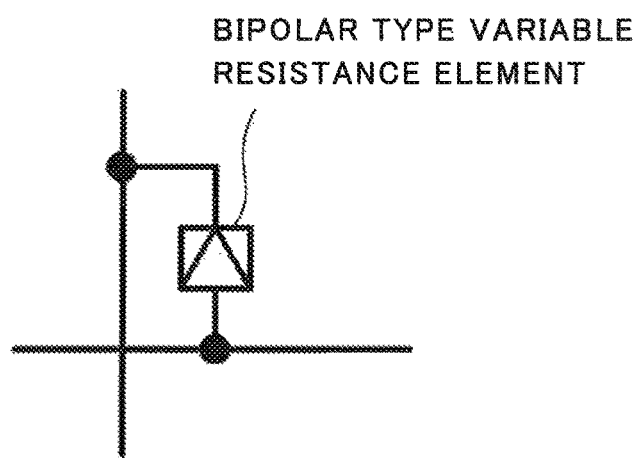
FIG. 5B is a diagram illustrating a connection configuration of a variable resistance element of a bipolar type variable resistance element.
Figure 5C:
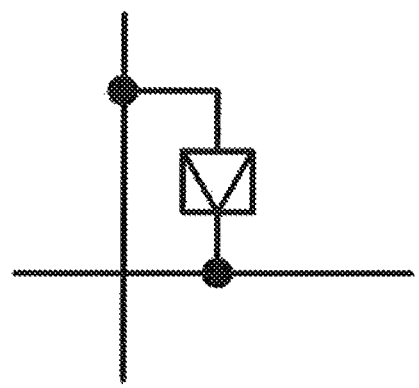
FIG. 5C is a diagram illustrating a connection configuration of a variable resistance element of a bipolar type variable resistance element whose connection polarity is reversed.
Figure 5D:
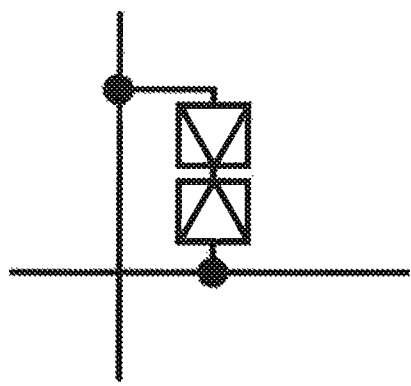
FIG. 5D is a diagram illustrating a connection configuration when two bipolar type variable resistance elements are provided.

In addition, for the variable resistance element 13, a unipolar type variable resistance element or a bipolar type variable resistance element may be used, or a combination thereof may be used, as illustrated in FIG. 5A to FIG. 5D. FIG. 5A to FIG. 5D are diagrams each illustrating a connection configuration of a variable resistance element. FIG. 5A is a diagram illustrating a unipolar type variable resistance element, FIG. 5B is a diagram illustrating a bipolar type variable resistance element, FIG. 5C is a diagram illustrating a case when a connection polarity in the case of FIG. 5B is reversed, and FIG. 5D is a diagram illustrating a case when two bipolar type variable resistance elements are provided.

When using a bipolar type variable resistance element, although both the case where a first electrode is connected to the side of the power supply node 14*a* and the case where a second electrode is connected to the side of the power supply node 14*a* are possible, more preferably, the second electrode is connected to the side of the power supply node 14*a*. The reason is as follows. In operating a crossbar switch type memory, a H level voltage is constantly applied to the variable resistance element in the H resistance state. Therefore, when the second electrode is connected to the side of the power supply node 14*a*, the power supply node 14*a* applies a voltage in a direction in which the variable resistance element transits to the H resistance, and thus, malfunction of transition to the L resistance state during operation can be prevented. It is to be noted that, in the present example embodiment, the polarity of the column wiring may be inverted, and thus, a configuration in which the second electrode is connected to the side of the power supply node 14*a* in advance is not taken.

In particular, in order to improve the reliability, a configuration in which bipolar type variable resistance elements are connected in series at different polarities as illustrated in FIG. 5D is further preferable. By taking the foregoing configuration, a voltage of the power supply node 14*a* is applied such that one of the bipolar type variable resistance elements connected in series becomes the H resistance state regardless of the signal level of the column wiring, and thus, ON resistance properties can be increased as a whole.

Figure 6:
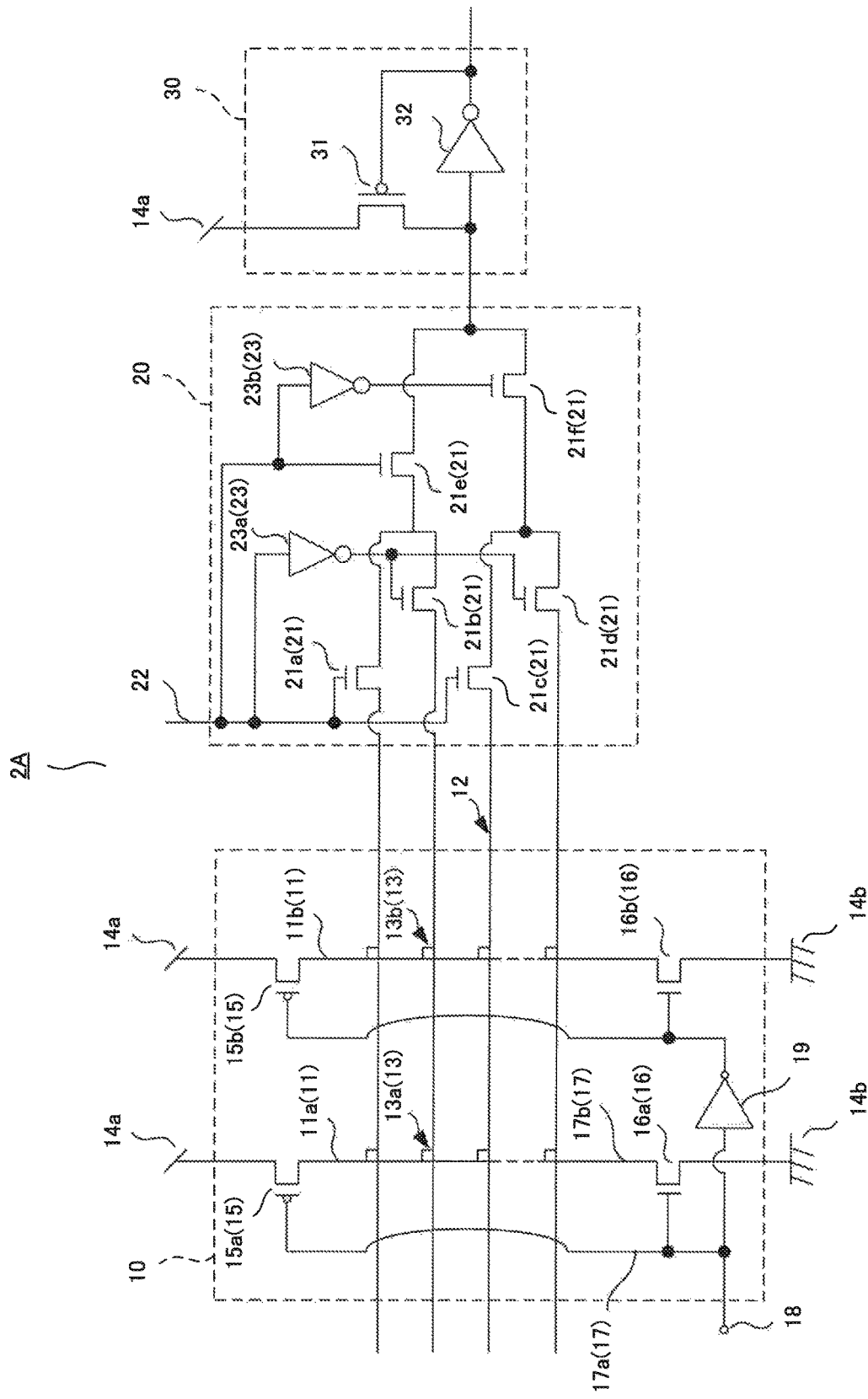
FIG. 6 is a circuit diagram of a LUT circuit using a crossbar switch type memory.

Next, a case when the foregoing crossbar switch type memory is used as a LUT circuit will be described. FIG. 6 is a circuit diagram of such a LUT circuit 2A. The LUT circuit 2A includes the crossbar switch type memory circuit 10 illustrated in FIG. 3, a data selection circuit 20, and a pull-up circuit 30.

The data selection circuit 20 is an n-input multiplexer circuit, and includes selection transistors 21 (21*a* to 21*d*) connected to the n row wirings 12. Furthermore, the data selection circuit 20 includes selection transistors 21 (21*e*, 21*f*) connected to outputs of the selection transistors 21*a*, 21*b*, a select line 22 into which a selection signal is inputted, and inverters 23 (23*a*, 23*b*) that invert the selection signal.

The selection transistors 21 are connected in a knockout format, and select and output one piece of data from data inputted through the plurality of row wirings 12 by the selection signal.

The pull-up circuit 30 includes a pull-up transistor 31 and an inverter 32. The pull-up transistor 31 is formed to be the opposite operation type from the selection transistors 21 (this means that the selection transistors 21 are p-type FETs when the pull-up transistor 31 is an n-type FET), and an output of the inverter 32 is inputted into a control terminal of the pull-up transistor 31.

Accordingly, a voltage drop generated in the selection transistors 21 is compensated. More specifically, when an input of the inverter 32 is the L level, the output thereof becomes the H level, and thus, the pull-up transistor 31 is turned off. In contrast, when the input of the inverter 32 is the H level, the output thereof becomes the L level, and thus, the pull-up transistor 31 is turned on. Since the pull-up transistor 31 is turned on, an input level of the inverter 32 is raised to a level of the power supply node 14*a*. Accordingly, the voltage drop generated in the selection transistors 21 is compensated.

It is to be noted that, as the selection transistors, n-type FETs are taken as an example, but p-type FETs may be used, and a transmission control terminal in which n-type FETs and p-type FETs are connected in parallel may be used. Furthermore, the multiplexer circuit may be formed with a combinational circuit by a known method.

As described above, even when there is a defect in a variable resistance element, programming can be appropriately performed, and the reliability of the LUT circuit is improved.

Second Example Embodiment

Next, a second example embodiment of the present invention will be described. It is to be noted that the same components as those of the first example embodiment are denoted by the same reference numerals, and the description is appropriately omitted.

In general, a variable resistance element sometimes transits to an unintended resistance state by a repeat of continuous voltage application (a repeat of programming). For example, when a voltage value of a programming voltage value or less is continuously applied to a variable resistance element in the H resistance state, the variable resistance element sometimes transits to the L resistance state.

It is known that the foregoing defect due to the voltage application (hereinafter, described as stress defect) occurs more easily when keeping the application under a condition where the polarity of the voltage is not changed (hereinafter, direct application) than when performing the application under a condition where the polarity of the voltage is alternately changed (hereinafter, described as alternating application).

In the present example embodiment, occurrence of the foregoing stress defect is prevented by performing alternating application in which the polarity of a voltage to be applied to a variable resistance element is inversed at every determined time.

Incidentally, an output of the crossbar switch type memory circuit 10 is changed by performing the alternating application for the variable resistance element. Thus, it is necessary for the output of the crossbar switch type memory circuit 10 not to change even when performing the alternating application for the variable resistance element.

Figure 7:
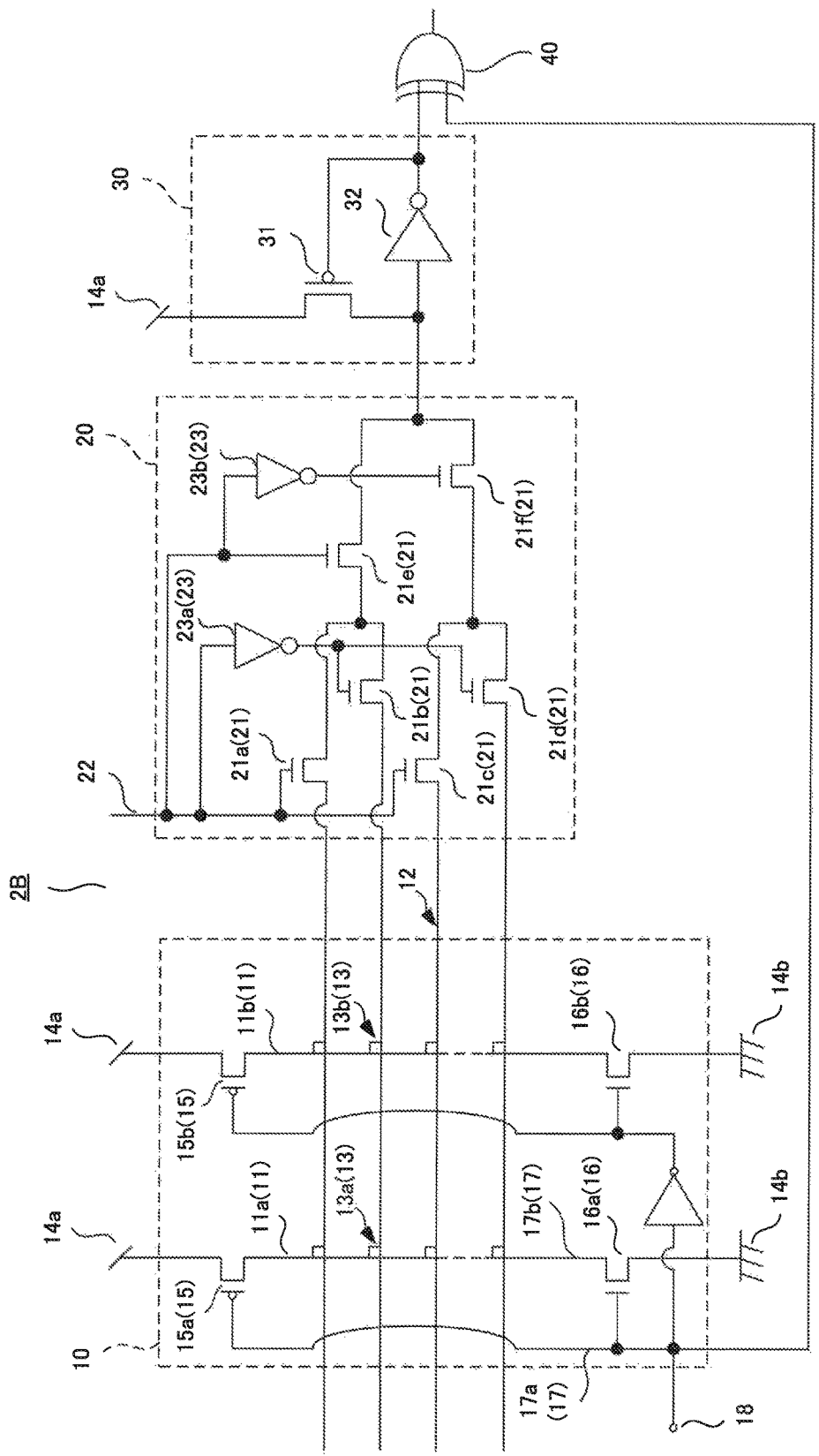
FIG. 7 is a circuit diagram of a LUT circuit according to a second example embodiment.

FIG. 7 is a LUT circuit 2B configured from the foregoing viewpoint. The LUT circuit 2B has a configuration in which a data inversion circuit 40 is added to the LUT circuit 2A illustrated in FIG. 6.

The data inversion circuit 40 is formed by an XOR logic circuit, one input terminal is connected to an output terminal of the inverter 32, and the other input terminal is connected to the polarity signal terminal 18. Therefore, the data inversion circuit 40 operates in synchronization with the crossbar switch type memory circuit 10.

According to the foregoing configuration, even when the signal level of the column wiring and a signal level outputted from the LUT circuit 2B are simultaneously inverted by the alternating application, an output level of the data inversion circuit 40 does not depend on an alternating application condition. More specifically, even when performing the alternating application for the variable resistance element, an output of the LUT circuit 2B is not different from that in the case of the direct application.

Therefore, the reliability of the crossbar switch type memory circuit 10 is improved.

Specific Example

Figure 8:
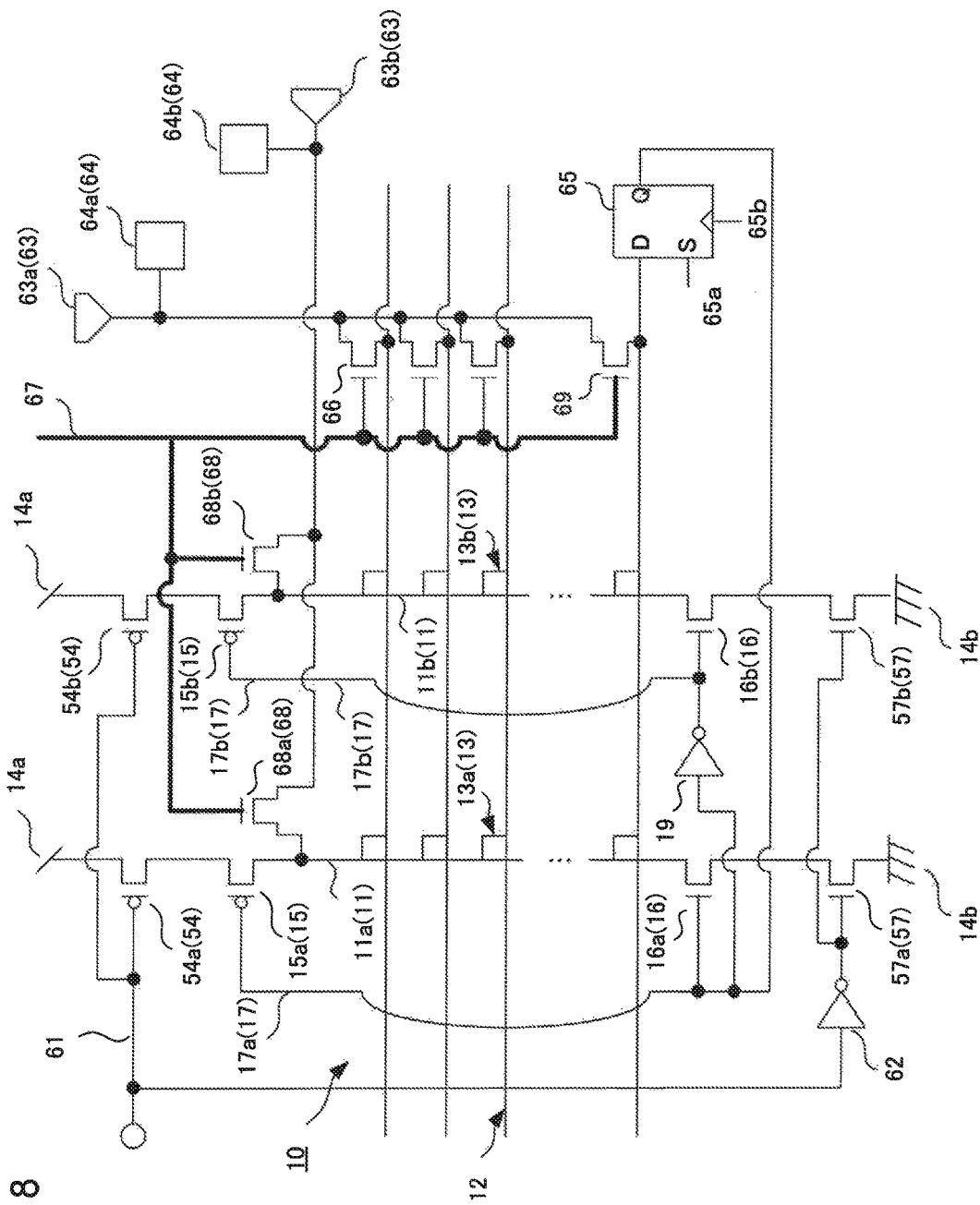
FIG. 8 is a circuit diagram of a crossbar switch type memory circuit used for describing an example.

Next, a specific example of the crossbar switch type memory circuit will be described. FIG. 8 is a circuit diagram of the crossbar switch type memory circuit according to the present specific example.

The crossbar switch type memory circuit is a 2×(n+1) size crossbar switch circuit composed of the n-bit crossbar switch type memory circuit 10 illustrated in FIG. 3 and a one-bit polarity memory bit.

The first column wiring 11a is connected to the power supply node 14a through the first power supply-side transistor 15a (15) and a first power supply disconnecting transistor 54a (54), and is connected to the ground node 14b through the first ground-side transistor 16a and a first ground disconnecting transistor 57a.

In addition, the second column wiring 11b is connected to the power supply node 14a through the second power supply-side transistor 15b and a second power supply disconnecting transistor 54b, and is connected to the ground node 14b through the second ground-side transistor 16b (16) and a second ground disconnecting transistor 57b (57). Here, p-type FETs are used as the power supply-side transistors, and n-type FETs are used as the ground-side transistors.

The first polarity control line 17a (17) is connected to the control terminals of the first power supply-side transistor 15a and the first ground-side transistor 16a, and the second polarity control line 17b (17) is connected to the control terminals of the second power supply-side transistor 15b and the second ground-side transistor 16b.

A polarity signal logically inverted by the inverter 19 that functions as a polarity inversion circuit is inputted into the second polarity control line 17b.

In addition, the first power supply disconnecting transistor 54a and the second power supply disconnecting transistor 54b are connected to a programming enable line 61, and an inversion signal of a programming enable signal is applied to the first ground disconnecting transistor 57a and the second ground disconnecting transistor 57b through an inverter 62.

Furthermore, for programming and reading of the variable resistance elements 13, a programming driver 63a (63) is connected to the respective column wirings 11 through selection transistors 68 (68a, 68b), and a programming driver 63b (63) is connected to the row wirings 12 through selection transistors 66. In addition, voltage value read circuits 64 (64a, 64b) are connected to outputs of the programming drivers 63. It is to be noted that one programming driver 63 may be commonly provided for each of the column wirings 11 and the row wirings 12.

Signals of n row wirings 12 among (n+1) row wirings 12 are used as memory data, and are outputted to a later stage circuit that is not illustrated. For example, when the above-described LUT circuit is provided in the later stage, the signals are outputted to a selection circuit that acts as a component of the LUT circuit. A signal outputted from the remaining one row wiring 12 is inputted into a polarity signal generation circuit 65.

In the present specific example, the polarity signal generation circuit 65 is configured by a D-type flip-flop with preset, and the signal from the row wiring 12 is inputted into a data terminal. An output of the polarity signal generation circuit 65 is outputted to the first polarity control line 17a.

Furthermore, the polarity signal generation circuit 65 has a set terminal 65a and a clock terminal 65b.

Figure 9:
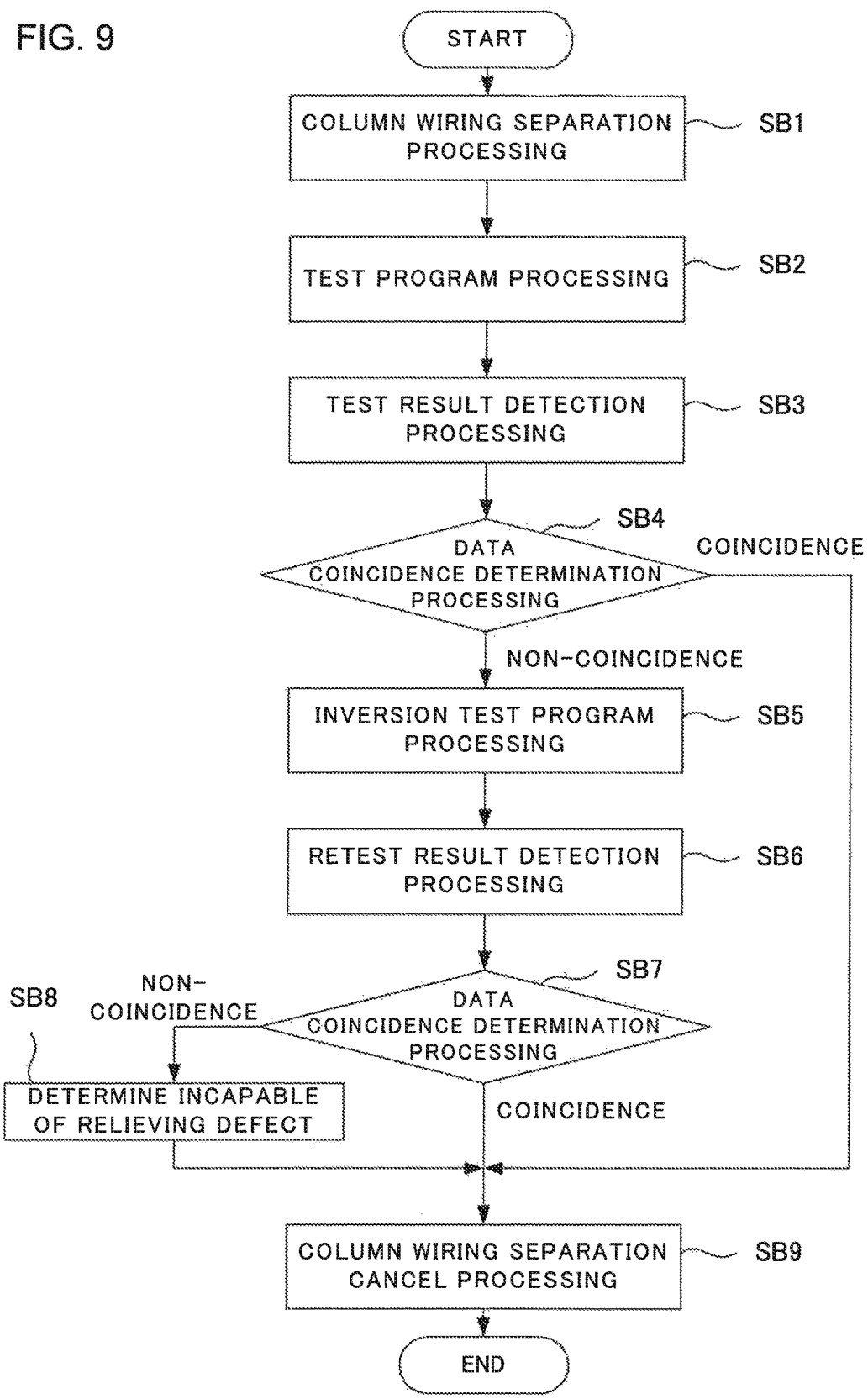
FIG. 9 is a flowchart illustrating a programming method.

Next, a programming method in the crossbar switch type memory circuit having the foregoing configuration will be described. FIG. 9 is a flowchart illustrating the programming method.

Step SB1: (Column Wiring Separation Processing)

First, an H level programming enable signal is inputted from the programming enable line 61. Accordingly, the first power supply disconnecting transistor 54a and the second power supply disconnecting transistor 54b are turned off, and the first ground disconnecting transistor 57a and the second ground disconnecting transistor 57b are turned off. Therefore, the column wirings 11 are separated from the power supply nodes 14a and the ground nodes 14b.

Step SB2: (Test Program Processing)

A selection signal is inputted into control terminals of the plurality of selection transistors 66 and 68 through a selection signal line 67. It is to be noted that the selection signal line 67 is connected to the selection transistors 66 and 68, and the selection signal line 67 is indicated by the heavy line like a bus in FIG. 8. The plurality of selection transistors 66 and 68 are separately controlled by the selection signal.

In this state, an output voltage value of one programming driver (designated as the programming driver 63a) is designated as a programming voltage value, and an output voltage value of the other (designated as the programming driver 63b) is designated as a voltage value of the ground node 14b. Accordingly, the programming voltage value is applied to both ends (a first electrode and a second electrode) of a variable resistance element 13, and programming is executed. The processing is performed for all of the selection transistors 66 by sequentially switching a selection transistor 66 to be turned on, so that programming is performed for all of the variable resistance elements 13.

Step SB3: (Test Result Detection Processing)

Since an output voltage of the programming driver 63 is changed in accordance with the resistance state of the variable resistance element 13, by comparing the output voltage with a reference voltage value separately given in the voltage value read circuit 64 connected in parallel to the programming driver 63, whether the variable resistance element 13 is in the H resistance state or the L resistance state can be read.

Step SB4: (Data Coincidence Determination Processing)

After the completion of programming and reading of all of the variable resistance elements 13 of the crossbar switch type memory circuit, a coincidence between programming data (write data) and read data (read data) is determined.

When the write data and the read data coincide, it is determined that the crossbar switch type memory circuit to be programmed has been normally programmed.

Steps SB5 to SB6: (Inversion Test Program Processing), (Retest Result Detection Processing)

When the write data and the read data do not coincide, it is determined that one of the variable resistance elements 13 is in the open state or the short state. In this case, all of the write data is inverted, programming is performed again, and the result thereof is detected.

Steps SB7 to SB8: After performing programming again, when the rewrite data and the reread data coincide, it is determined that the crossbar switch type memory has been relieved from the influence of a defect state. In contrast, when the rewrite data and the reread data do not coincide, the defect cannot be relieved by changing the program condition, and thus, the processing is terminated. At this time, defect information may be outputted.

Step SB9: Then, the programming enable signal is made to be the L level. By making the programming enable signal be the L level, separation of the column wirings 11 from the power supply nodes 14a and the ground nodes 14b is canceled.

Figure 10:
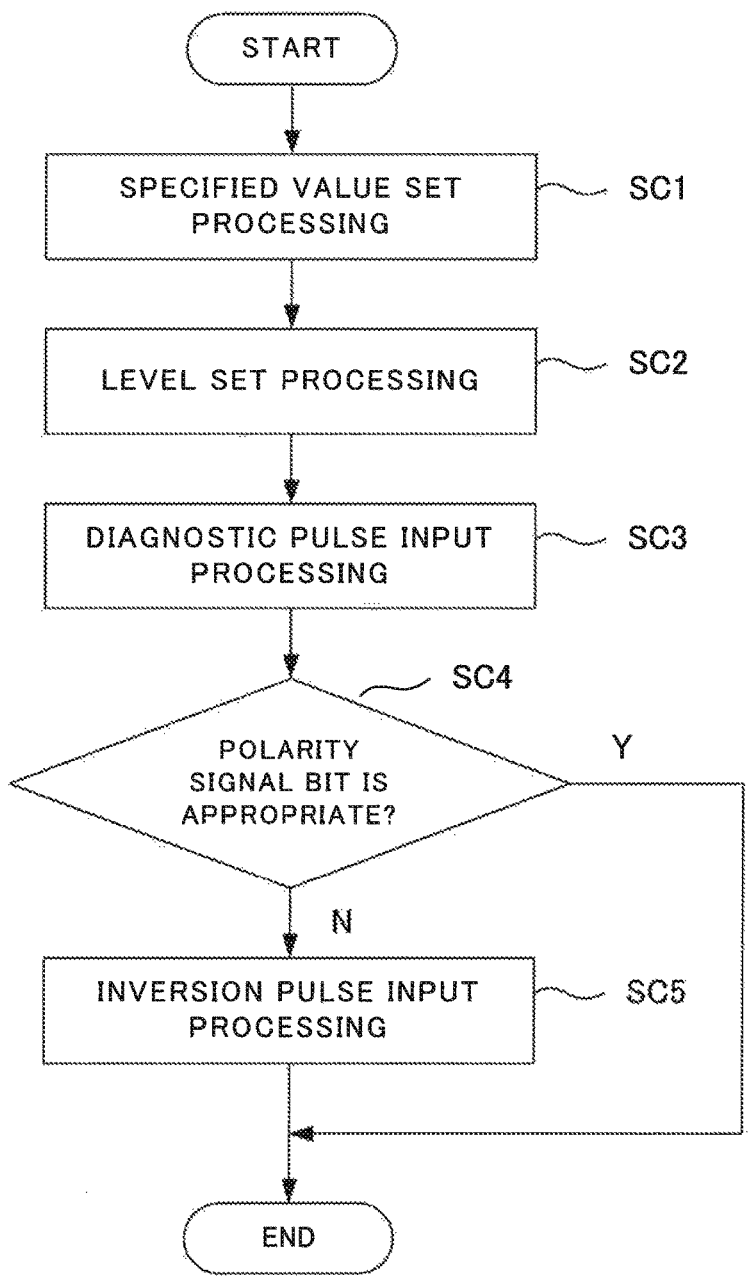
FIG. 10 is a flowchart of defect determination program processing.
Figure 11:
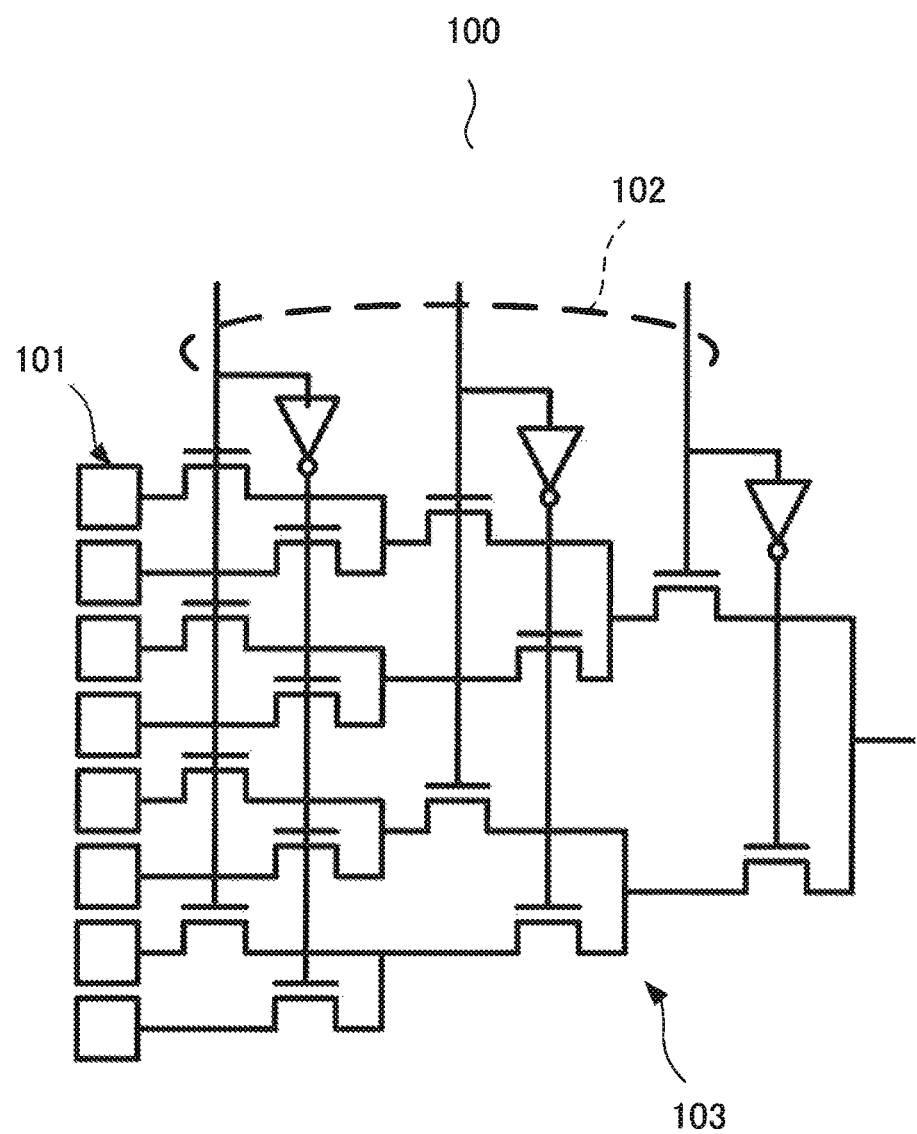
FIG. 11 is a circuit diagram of a LUT circuit used for describing related arts.
Figure 12:
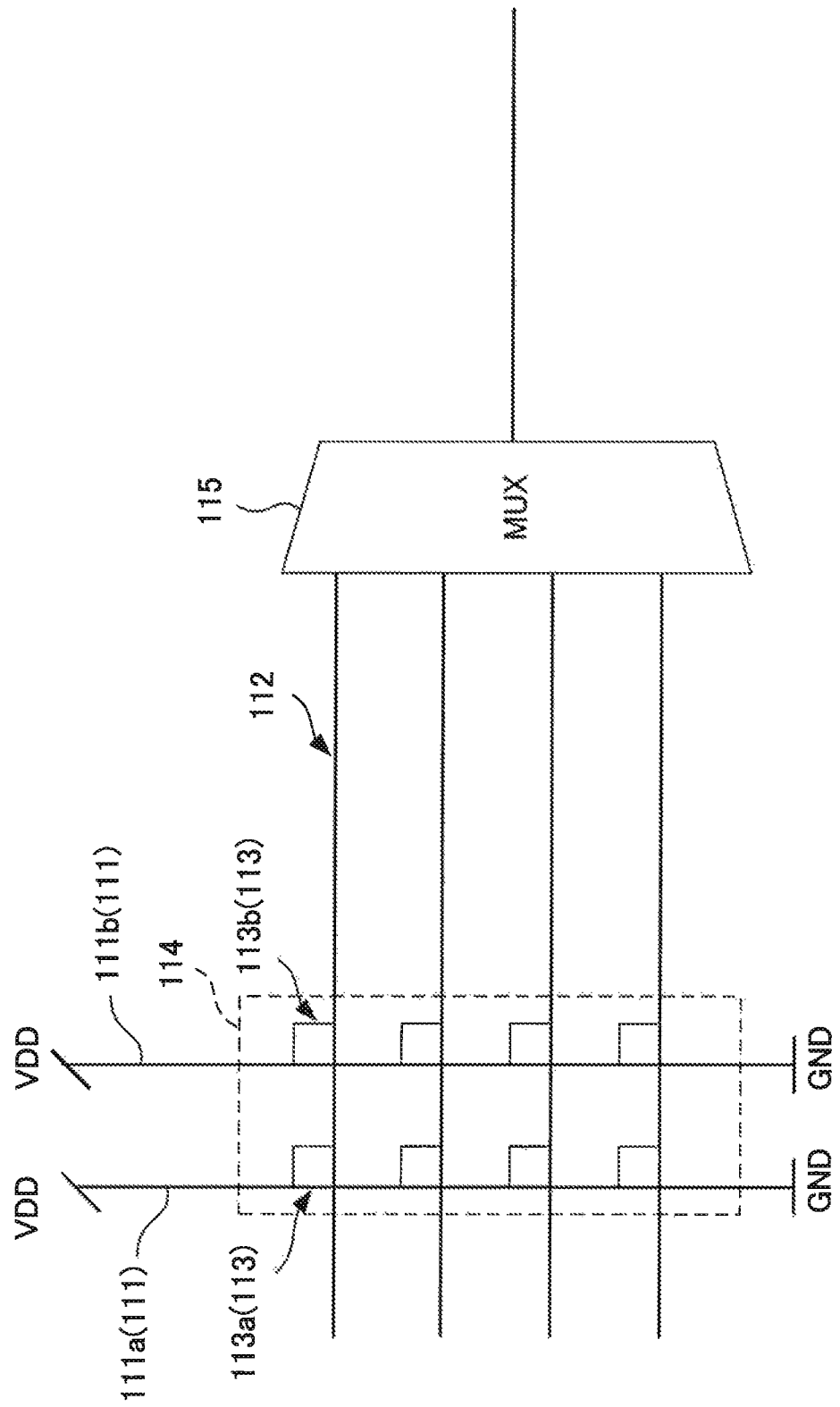
FIG. 12 is a diagram in which a crossbar switch is configured by connecting variable resistance elements to column wirings and row wirings.

Next, defect determination program processing in which the presence or absence of a defect of a variable resistance element in the crossbar switch type memory circuit is determined and, when there is a defect, the crossbar switch type memory circuit can be relieved from the influence of the defect will be described. FIG. 10 is a flowchart of the foregoing defect determination program processing.

Step SC1: (Specified Value Set Processing)

First, the first variable resistance element 13a provided at an intersection point of the row wiring 12 connected to the polarity signal generation circuit 65 with the first column wiring 11a is programmed to be in the H resistance state, and the second variable resistance element 13b provided at an intersection point of the row wiring 12 with the second column wiring 11b is programmed to be in the L resistance state. This state is referred to and defined as a specified value of a polarity signal bit.

Step SC2: (Column Wiring Level Set Processing)

Next, the set terminal of the polarity signal generation circuit 65 is made to be the H level. Accordingly, an H level signal is outputted from the polarity signal generation circuit 65, so that a level of the first column wiring 11a becomes a level of the ground node 14b, and a level of the second column wiring 11b becomes a level of the power supply node 14a.

Step SC3: (Diagnostic Pulse Input Processing)

At this time, in the case where the polarity signal bit is programmed to be the specified value, the H level signal is inputted into an input terminal of the polarity signal generation circuit 65 in the same manner. One pulse of the H level signal is made to be inputted into the clock terminal of the polarity signal generation circuit 65.

Step SC4: (Polarity signal Bit Appropriateness Determination)

The output of the polarity signal generation circuit 65 maintains the H level by the pulse signal made to be inputted into the clock terminal. Therefore, a polarity signal of the polarity control line 17 is not changed.

However, in the case where the polarity signal bit is not programmed to be the specified value, when the output of the polarity signal generation circuit 65 is set to be the H level, an L level signal is inputted into the input of the polarity signal generation circuit 65.

Step SC5: (Inversion Pulse Input Processing)

One pulse of the H level signal is made to be inputted into the clock terminal of the polarity signal generation circuit 65. An output level of the polarity signal generation circuit 65 is changed into the L level by the pulse input. Therefore, a signal level of the first column wiring 11a becomes the H level, and a signal level of the second column wiring 11b becomes the L level.

Accordingly, when the crossbar switch type memory is programmed so as to apply polarity signal bit data of the specified value together with predetermined programming data, correct data can be outputted from the crossbar switch type memory.

In addition, in order to relieve a defective bit, when reprogramming is performed by inverting all of the predetermined programming data and the polar bit data of the expected value, the column wiring polarity is inverted, and accordingly, the crossbar switch type memory can output predetermined data in the same manner.

By taking the configuration of the present specific example, a one-bit polarity signal bit is applied to the crossbar switch type memory that outputs n-bit data, so that a bit defect of the variable resistance elements 13 configuring the crossbar switch type memory can be relieved.

Although the present invention has been described above with reference to the example embodiments (and the example), the present invention is not limited to the above-described example embodiments (and the example). For the configurations and the details of the present invention, various changes that can be understood by a person skilled in the art may be made within the scope of the present invention.

This application is based upon and claims the benefit of priority from Japanese Patent Application No. 2015-041455, filed on Mar. 3, 2015, the disclosure of which is incorporated herein in its entirety by reference.

REFERENCE SIGNS LIST 10 crossbar switch type memory circuit
11 column wiring
11a first column wiring
11b second column wiring
12 row wiring
13 variable resistance element
13a first variable resistance element
13b second variable resistance element
14a power supply node
14b ground node
15 power supply-side transistor 15a first power supply-side transistor
15b second power supply-side transistor
16 ground-side transistor
16a first ground-side transistor
16b second ground-side transistor
17 polarity control line
17a first polarity control line
17b second polarity control line
18 polarity signal terminal
19 inverter (logic inversion circuit)
20 data selection circuit
21 (21a to 21f) selection transistor
22 select line
30 pull-up circuit
31 pull-up transistor
32 inverter
40 data inversion circuit
54 power supply disconnecting transistor
54b second power supply disconnecting transistor
54a first power supply disconnecting transistor
57 ground disconnecting transistor
57a first ground disconnecting transistor
57b second ground disconnecting transistor
61 programming enable line
62 inverter
63 programming driver
63a one programming driver
63b the other programming driver
64 voltage value read circuit
65 polarity signal generation circuit
66, 68 selection transistor
67 selection signal line

What is claimed is:

1. A crossbar switch type memory circuit that stores information in accordance with a resistance state of a variable resistance element, the crossbar switch type memory circuit comprising:
a first unit including a first column wiring to which one end of a first variable resistance element is connected, a first power supply-side transistor that controls a connection of the first column wiring and a power supply node, a first ground-side transistor that controls a connection of the first column wiring and a ground node, which is an opposite operation type to the first power supply-side transistor, and a first polarity control line that is connected to control terminals of the first power supply-side transistor and the first ground-side transistor, and turns on one of the first power supply-side transistor and the first ground-side transistor and turns off the other thereof by a polarity signal from a polarity signal terminal;
a second unit including a second column wiring to which one end of a second variable resistance element is connected, a second power supply-side transistor that controls a connection of the second column wiring and the power supply node, which is the same operation type as the first power supply-side transistor, a second ground-side transistor that controls a connection of the second column wiring and the ground node, which is an opposite operation type to the second power supply-side transistor, a logic inversion circuit that inverts a polarity of the polarity signal from the polarity signal terminal and outputs the polarity-inverted signal, and a second polarity control line that is connected to control terminals of the second power supply-side transistor and the second ground-side transistor, and turns on one of the second power supply-side transistor and the second ground-side transistor and turns off the other thereof by the polarity signal from the logic inversion circuit; and
n row wirings (n: positive integer) to which the other ends of the first and second variable resistance elements are connected, wherein
a one-bit memory is formed by the first variable resistance element and the second variable resistance element, and information stored in the memory is outputted from the corresponding row wiring.

2. The crossbar switch type memory circuit according to claim 1, comprising:
a first voltage disconnecting transistor that is provided between the first column wiring and the first power supply-side transistor, and is the same operation type as the first power supply-side transistor;
a first ground disconnecting transistor that is provided between the first column wiring and the first ground-side transistor, and is the same operation type as the first ground-side transistor;
a second voltage disconnecting transistor that is provided between the second column wiring and the second power supply-side transistor, and is the same operation type as the second power supply-side transistor; and
a second ground disconnecting transistor that is provided between the second column wiring and the second ground-side transistor, and is the same operation type as the second ground-side transistor.

3. The crossbar switch type memory circuit according to claim 2, wherein
the first power supply-side transistor, the first voltage disconnecting transistor, the first ground-side transistor, the first ground disconnecting transistor, the second power supply-side transistor, the second voltage disconnecting transistor, the second ground-side transistor, and the second ground disconnecting transistor are field effect transistors.

4. The crossbar switch type memory circuit according to claim 1, wherein
each of the first and second variable resistance elements is any one of a bipolar type switch whose resistance state is changed in response to a polarity of an applied voltage applied to each of the variable resistance elements, a unipolar type switch, and a switch in which two of the bipolar type switches are connected at a reverse polarity.

5. A look-up table circuit used when reconfiguring a logic circuit by a crossbar switch formed by a variable resistance element, the look-up table circuit comprising:
the crossbar switch type memory circuit according to claim 1; and
a selection circuit that selects one piece of data from a plurality of pieces of data outputted from the crossbar switch type memory circuit.

6. The look-up table circuit according to claim 5, wherein
a pull-up circuit that, when a signal level of data outputted after being selected by the selection circuit is affected by a voltage drop caused by the selection circuit, compensates the voltage drop is provided.

7. The look-up table circuit according to claim 6, wherein
a data inversion circuit that, when a polarity of a voltage outputted from the power supply node is alternately changed, even if the data outputted from the crossbar switch type memory circuit, which corresponds to resistance states of the first and second variable resistance elements, is varied in synchronization with the voltage outputted from the power supply node, compensates the variation of the data is provided.

8. The look-up table circuit according to claim 7, comprising:
a data inversion circuit formed by a two-input XOR circuit, which inverts an output from the pull-up circuit in synchronization with the polarity signal.

9. The look-up table circuit according to claim 5, wherein
a leakage current flowing into the corresponding row wiring through the first variable resistance element and a leakage current flowing into the corresponding row wiring through the second variable resistance element are measured, and the variable resistance element having a smaller leakage current is made to be in a high resistance state.

10. A programming method of a crossbar switch type memory circuit, in which resistance states of first and second variable resistance elements are programmed to be complementary and data is stored, the programming method comprising:
when information written by programming the first variable resistance element to be in a high resistance state or a low resistance state and programming the second variable resistance element to be in the low resistance state or the high resistance state is designated as write data, and information obtained by reading the written information is designated as read data, when the write data written in the crossbar switch type memory circuit and the read data read at this time do not coincide, performing writing again with data obtained by inverting a polarity of the write data.

* * * * *